(12) United States Patent
Shin et al.

(10) Patent No.: US 10,770,527 B2
(45) Date of Patent: Sep. 8, 2020

(54) DISPLAY PANEL AND DISPLAY DEVICE INCLUDING THE SAME

(71) Applicant: SAMSUNG DISPLAY CO., LTD., Yongin-si, Gyeonggi-Do (KR)

(72) Inventors: Hyuneok Shin, Gwacheon-si (KR); Taewook Kang, Seongnam-si (KR); Gyungmin Baek, Yongin-si (KR); Juhyun Lee, Seongnam-si (KR)

(73) Assignee: Samsung Display CO., Ltd., Yongin-si (KR)

( * ) Notice: Subject to any disclaimer, the term of this patent is extended or adjusted under 35 U.S.C. 154(b) by 0 days.

(21) Appl. No.: 16/298,391

(22) Filed: Mar. 11, 2019

(65) Prior Publication Data

US 2019/0288043 A1   Sep. 19, 2019

(30) Foreign Application Priority Data

Mar. 14, 2018   (KR) .......................... 10-2018-0029859

(51) Int. Cl.
*H01L 51/52* (2006.01)
*H01L 27/32* (2006.01)
*H01L 51/50* (2006.01)

(52) U.S. Cl.
CPC ...... *H01L 27/3246* (2013.01); *H01L 27/3232* (2013.01); *H01L 27/3272* (2013.01); *H01L 51/5209* (2013.01); *H01L 51/5215* (2013.01); *H01L 51/5218* (2013.01); *H01L 51/5234* (2013.01); *H01L 51/5253* (2013.01); *H01L 51/5056* (2013.01); *H01L 51/5072* (2013.01)

(58) Field of Classification Search
CPC ............. H01L 27/3216; H01L 27/3218; H01L 27/3232; H01L 27/3246; H01L 27/3248; H01L 27/3272; H01L 51/5056; H01L 51/5072; H01L 51/5209; H01L 51/5215; H01L 51/5218; H01L 51/5234; H01L 51/5253; H01L 51/5284
USPC .......................................................... 257/40
See application file for complete search history.

(56) References Cited

U.S. PATENT DOCUMENTS

| | | |
|---|---|---|
| 7,982,386 B2 | 7/2011 | Baek et al. |
| 8,502,230 B2 | 8/2013 | Jeong et al. |
| 9,391,130 B2 | 7/2016 | Yang et al. |
| 9,859,354 B2 | 1/2018 | Kang et al. |
| 9,859,355 B2 | 1/2018 | Lim et al. |

(Continued)

FOREIGN PATENT DOCUMENTS

| | | |
|---|---|---|
| KR | 10-1234228 B1 | 2/2013 |
| KR | 10-2016-0008681 A | 1/2016 |

(Continued)

*Primary Examiner* — Long K Tran
(74) *Attorney, Agent, or Firm* — Lewis Roca Rothgerber Christie LLP

(57) ABSTRACT

A display panel includes a substrate including a circuit layer, an insulation layer on the substrate, the insulation layer defining a hole, a first electrode on the insulation layer, the first electrode being electrically connected to the circuit layer in the hole, a light absorbing layer on the first electrode and overlapping the hole, a pixel defining layer on the insulation layer and defining an opening through which a top surface of the first electrode is exposed, at least one organic layer including a light emitting layer in the opening, and a second electrode on the at least one organic layer.

20 Claims, 11 Drawing Sheets

(56) References Cited

U.S. PATENT DOCUMENTS

| | | | |
|---|---|---|---|
| 2016/0126466 A1* | 5/2016 | Jeong | H01L 51/0072 |
| | | | 257/40 |
| 2016/0260780 A1* | 9/2016 | Kim | H01L 51/0097 |
| 2017/0117480 A1* | 4/2017 | Oh | H01L 51/5076 |

FOREIGN PATENT DOCUMENTS

| KR | 10-2016-0021329 A | 2/2016 |
|---|---|---|
| KR | 10-2016-0054076 A | 5/2016 |
| KR | 10-2016-0130071 A | 11/2016 |

* cited by examiner

DISPLAY PANEL AND DISPLAY DEVICE INCLUDING THE SAME

CROSS-REFERENCE TO RELATED APPLICATIONS

Korean Patent Application No. 10-2018-0029859, filed on Mar. 14, 2018, in the Korean Intellectual Property Office, and entitled: "Display Panel and Display Device Including the Same," is incorporated by reference herein in its entirety.

BACKGROUND

1. Field

Embodiments relate to a display panel and a display device.

2. Description of the Related Art

Various display devices used in multimedia devices such as televisions, mobile phones, table computers, navigation devices, and game consoles are being developed.

SUMMARY

Embodiments are directed to a display panel including a substrate including a circuit layer, an insulation layer on the substrate, the insulation layer defining a hole, a first electrode on the insulation layer, the first electrode being electrically connected to the circuit layer in the hole, a light absorbing layer on the first electrode and overlapping the hole, a pixel defining layer on the insulation layer and defining an opening through which a top surface of the first electrode is exposed, at least one organic layer including a light emitting layer in the opening, and a second electrode on the at least one organic layer.

The light absorbing layer may include molybdenum (Mo) oxide.

The light absorbing layer may further include at least one oxide of vanadium (V), niobium (Nb), tantalum (Ta), titanium (Ti), tungsten (W), germanium (Ge), tin (Sn), selenium (Se), or zirconium.

The light absorbing layer may include molybdenum (Mo) oxide and tantalum (Ta) oxide.

The light absorbing layer may be directly on the first electrode.

The light absorbing layer may be covered by the pixel defining layer and may not overlap the light emitting layer.

The light absorbing layer may overlap the first electrode and the pixel defining layer.

The light absorbing layer may have a thickness of 350 Å to 800 Å.

The light absorbing layer may further include an extension absorbing part extending to a top surface of the insulation layer and non-overlapping the light emitting layer.

The first electrode may include a reflective electrode, and the second electrode may include a transmissive electrode.

The first electrode may include a multilayered metal layer of ITO/Ag/ITO.

The first electrode may include a stepped electrode part along a stepped portion of the hole and a flat electrode part extending from the stepped electrode part, the flat electrode part being on the insulation layer.

The at least one organic layer may include a hole transfer region between the first electrode and the light emitting layer and an electron transfer region between the light emitting layer and the second electrode.

The display panel may further include an encapsulation layer on the second electrode.

Embodiments are also directed to a display panel including a substrate including a circuit layer, an insulation layer on the substrate, a first electrode on the insulation layer, the first electrode including at least one stepped part. a light absorbing layer on the at least one stepped part, a pixel defining layer on the insulation layer and defining an opening through which a top surface of the first electrode is exposed, at least one organic layer in the opening, the at least one organic layer including a light emitting layer on the first electrode exposed through the opening, and a second electrode on the at least one organic layer.

A hole may be defined in the insulation layer. The at least one stepped part may overlap the hole.

The light absorbing layer may include molybdenum (Mo) oxide and tantalum (Ta) oxide.

Embodiments are also directed to a display device including a display panel and a polarizing member on the display panel. The display panel includes a substrate including a circuit layer, an insulation layer on the substrate and defining a hole, a first electrode on the insulation layer and electrically connected to the circuit layer in the hole, a light absorbing layer overlapping the hole, the light absorbing layer being on the first electrode, a pixel defining layer on the insulation layer and defining an opening through which a top surface of the first electrode is exposed, at least one organic layer including a light emitting layer in the opening, and a second electrode on the at least one organic layer.

The polarizing member may include a linear polarizer and a $\lambda/4$ phase retarder between the linear polarizer and the display panel.

The light absorbing layer may include molybdenum (Mo) oxide and tantalum (Ta) oxide.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
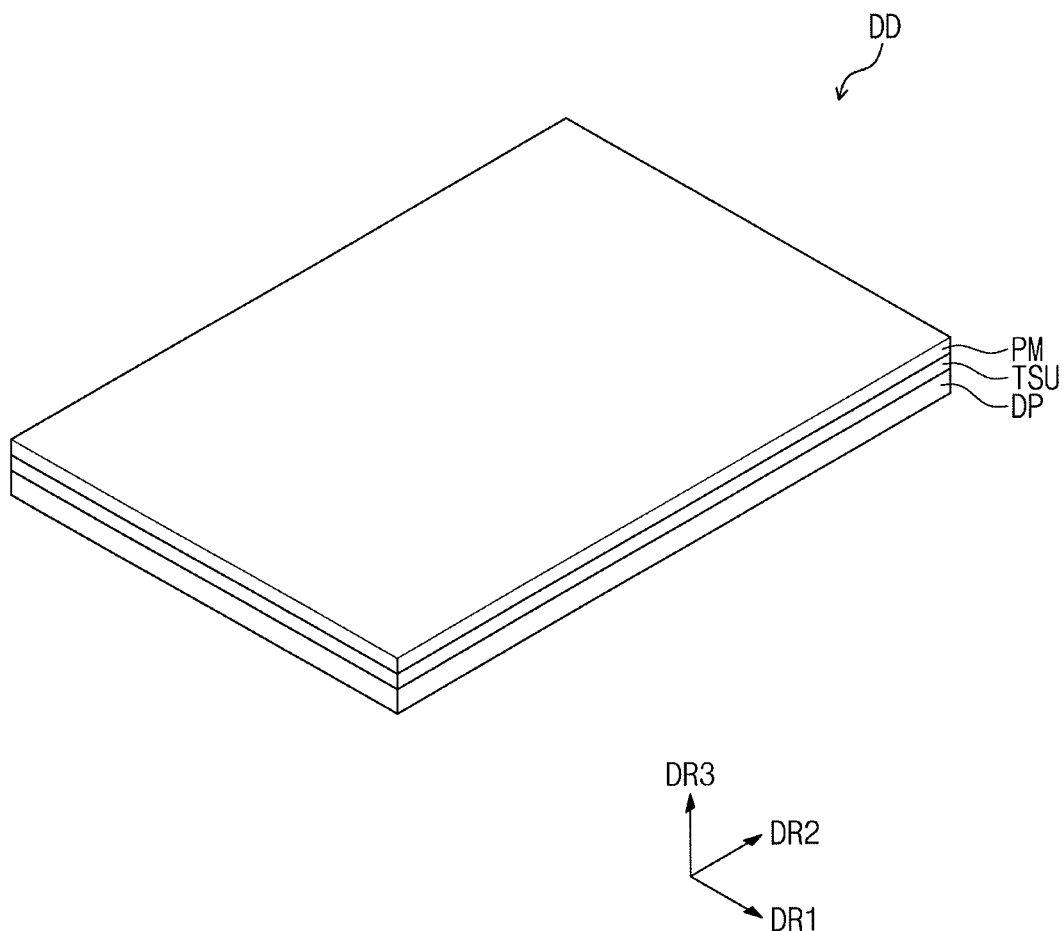
FIG. 1 illustrates a perspective view of a display device according to an embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Herein, "directly disposed" may indicate that there is no layer, film, region, plate, or the like between a portion of the layer, the layer, the region, the plate, or the like and the other portion. For example, "directly disposed" may mean being disposed without using an additional member such and an adhesion member between two layers or two members.

FIG. 1 illustrates a perspective view of a display device DD according to an embodiment. The display device DD may include a display panel DP, an input sensor TSU disposed on the display panel DP, and a polarizing member PM disposed on the display panel DP. The polarizing member PM may be disposed on the input sensor TSU.

In an embodiment, the display panel DP may be an organic electroluminescence display panel. The polarizing member PM may block external light provided to the display panel DP from the outside. The polarizing member PM may reduce reflected light generated in the display panel DP by the external light.

The input sensor TSU may recognize user's direct touch, user's indirect touch, object's direct touch, or object's indirect touch. The input sensor TSU may sense at least one of a position or intensity (a pressure) of touch applied from the outside. The input sensor TSU according to an embodiment may have a suitable structures or be made of suitable materials. For example, in the display device DD according to an embodiment, the input sensor TSU may be a touch sensor that senses touch.

The display device DD may include the input sensor TSU and the polarizing member PM as illustrated in FIG. 1. In some implementations, the input sensor TSU may be omitted.

Figure 2:
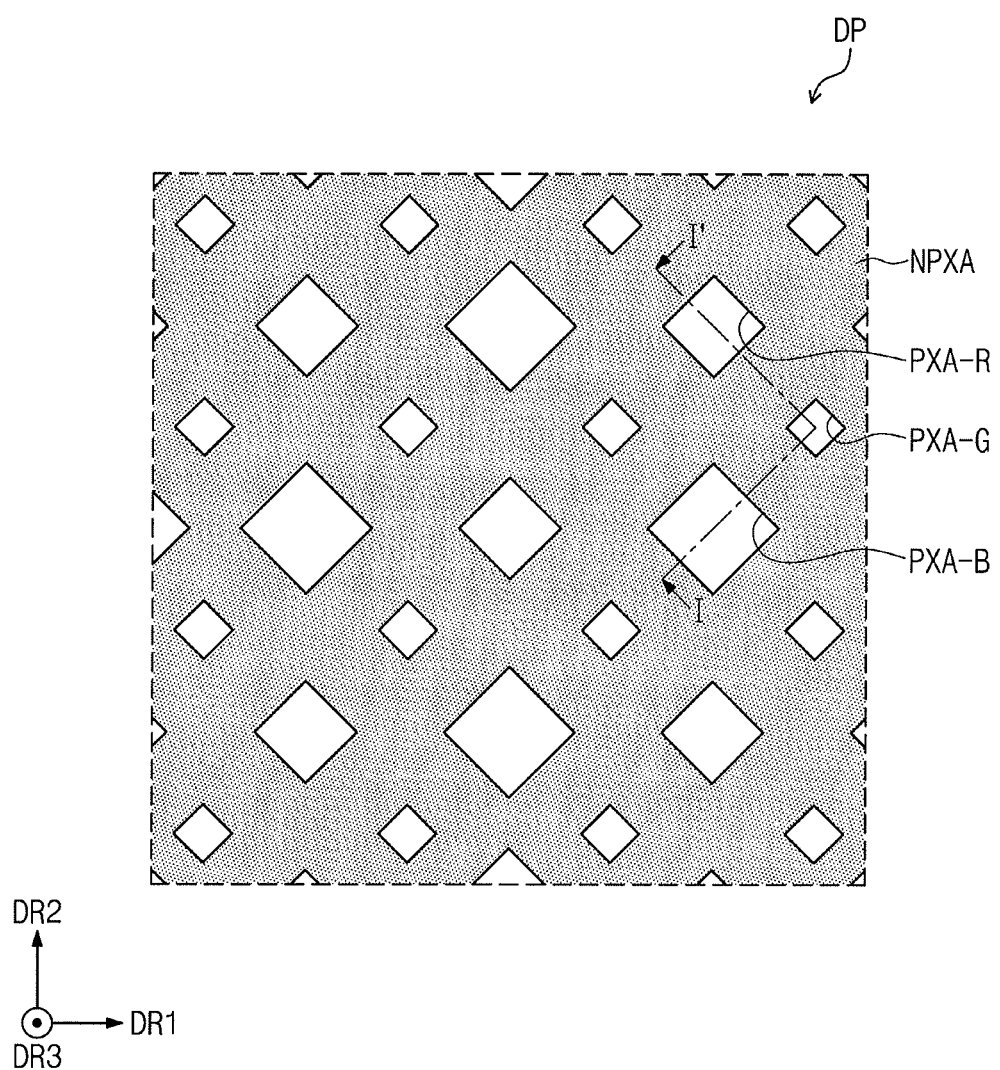
FIG. 2 illustrates a plan view depicting a portion of a display panel provided in the display device according to an embodiment.
Figure 3:
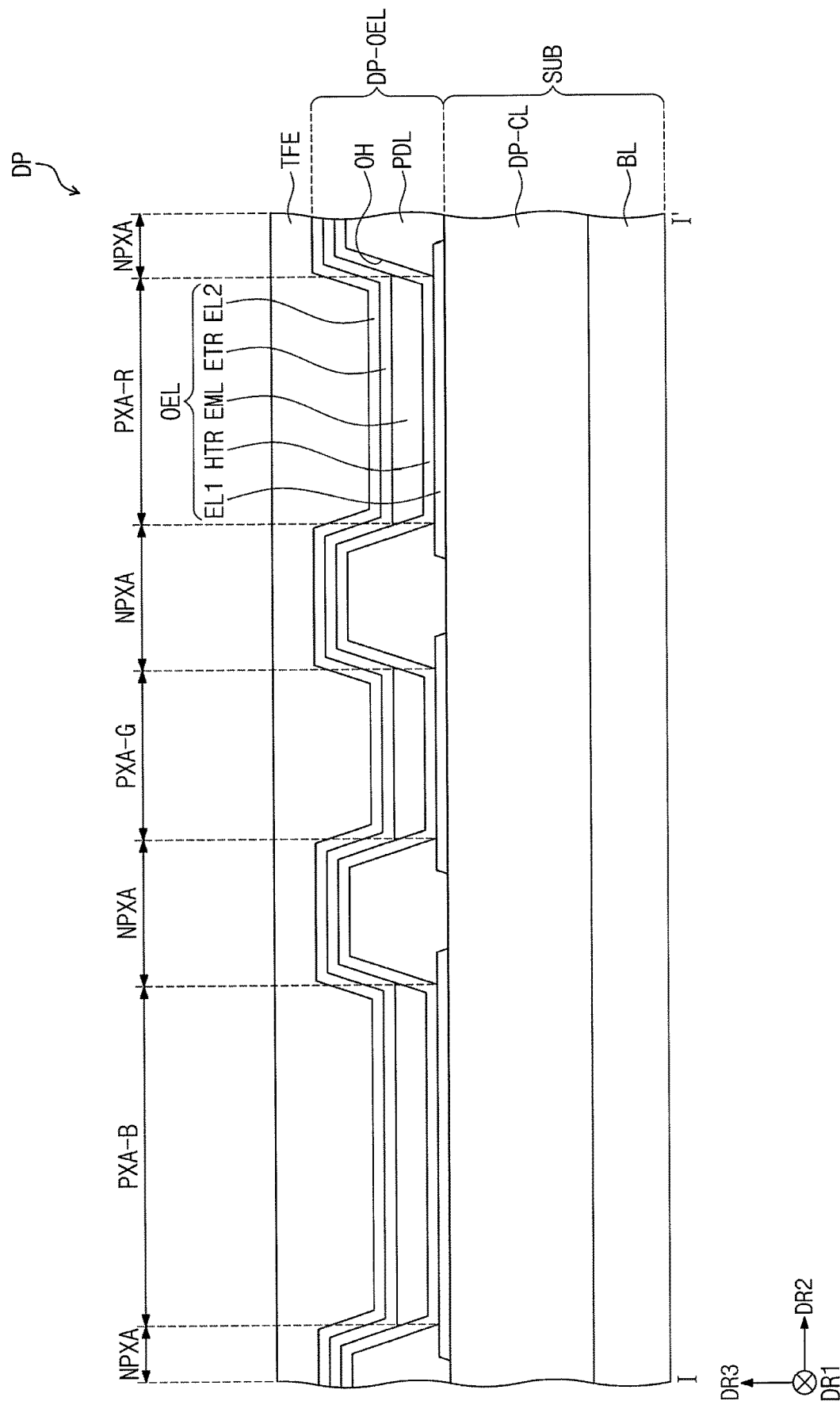
FIG. 3 illustrates a cross-sectional view taken along line I-I' of FIG. 2.
Figure 4:
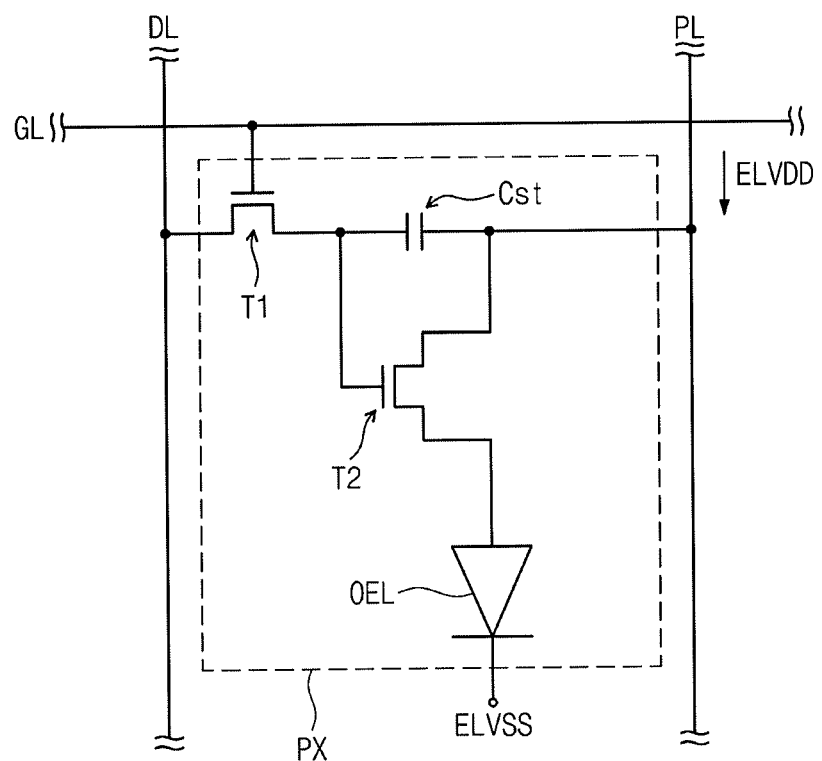
FIG. 4 illustrates an equivalent circuit diagram of a pixel according to an embodiment.
Figure 5:
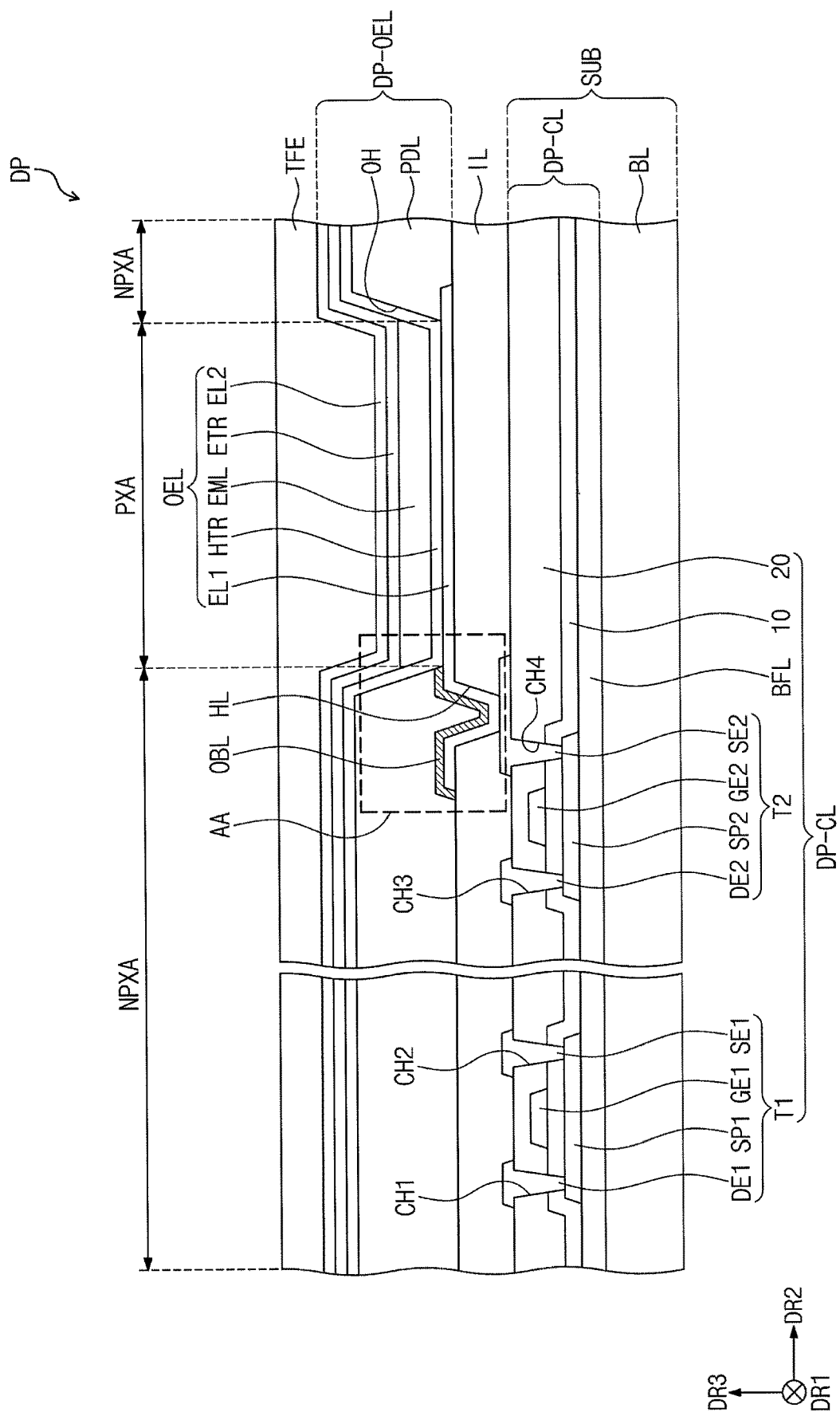
FIG. 5 illustrates a cross-sectional view of the display panel according to an embodiment.

FIG. 2 illustrates a plan view of a portion of the display panel DP provided in the display device DD according to an embodiment. FIG. 3 illustrates a cross-sectional view taken along line I-I' of FIG. 2. Referring to FIGS. 2 and 3, the display panel DP may include a non-emission area NPXA and emission areas PXA-R, PXA-G, and PXA-B. Each of the emission areas PXA-R, PXA-G, and PXA-B may correspond to an emission area PXA that will be described below in detail in FIG. 5. Each of the emission areas PXA-R, PXA-G, and PXA-B may be an area through which light generated in an organic electroluminescence device OEL that will be described in FIGS. 4 and 5 is emitted.

The emission areas PXA-R, PXA-G, and PXA-B may be divided into a plurality of groups according to colors of light generated in the organic electroluminescence device OEL. In the display panel DP of FIGS. 2 and 3 according to an embodiment, the emission areas PXA-R, PXA-G, and PXA-B, which are divided into three groups emitting red light, green light, and blue light, are exemplarily illustrated.

The emission areas PXA-R, PXA-G, and PXA-B may have different surface areas according to the colors of light emitted from the light emitting layer EML of the organic electroluminescence device OEL. For example, referring to FIG. 2, in the display panel DP according to an embodiment, the emission area PXA-B of the organic electroluminescence device OEL, which emits the blue light, may have the largest surface area, and the emission area PXA-G of the electroluminescence device OEL, which emits the green light, may have smallest surface area. In some implementations, the emission areas PXA-R, PXA-G, and PXA-B may emit light having colors other than red light, green light, and blue light, may have the same surface area, or may have different ratios for the emission areas PXA-R, PXA-G, and PXA-B from those shown in FIG. 2.

The display panel DP according to an embodiment may include a substrate SUB and a display device layer DP-OEL, which are successively disposed in a direction of the third directional axis DR3. An encapsulation layer TFE may be disposed on the display device layer DP-OEL. The substrate SUB may include a base layer BL and a circuit layer DP-CL.

Figure 6:
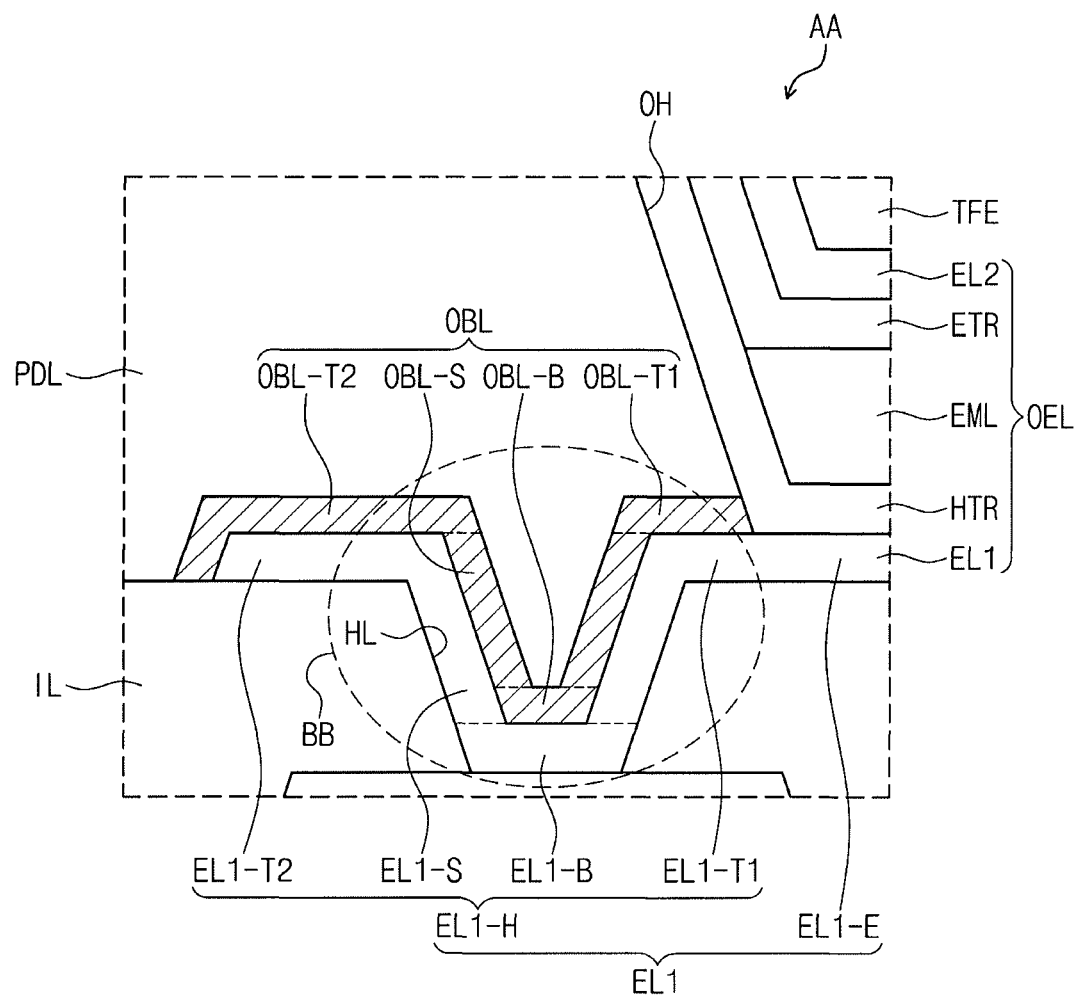
FIG. 6 illustrates a detailed cross-sectional view of an area AA of FIG. 5.
Figure 7:
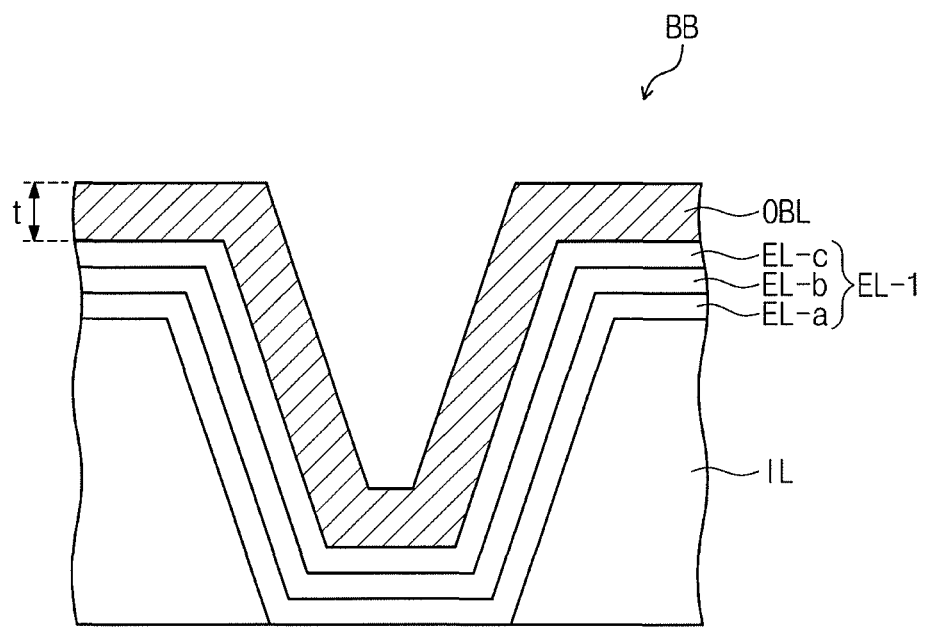
FIG. 7 illustrates a detailed cross-sectional view of an area BB of FIG. 6.

FIG. 4 illustrates an equivalent circuit diagram of the pixel PX according to an embodiment. FIG. 5 illustrates a cross-sectional view of the display panel according to an embodiment. FIG. 6 illustrates a detailed cross-sectional view of an area AA of FIG. 5, and FIG. 7 illustrates a detailed cross-sectional view of an area BB of FIG. 6.

FIG. 4 illustrates one scan line GL, one data line DL, and a power line PL, the pixel PX being connected to the scan line GL, the data line DL, and the power line PL, as an example. The configuration of the pixel PX may vary from that of FIG. 4.

The pixel PX may include a first transistor T1 (or a switching transistor), a second transistor T2 (or a driving transistor), and a capacitor Cst as pixel driving circuits driving the organic electroluminescence device OEL. A first power voltage ELVDD may be provided to the second transistor T2, and a second power voltage ELVSS may be provided to the organic electroluminescence device OEL. The second power voltage ELVSS may be less than the first power voltage ELVDD.

The first transistor T1 may output a scan signal applied to the data line DL in response to a scanning signal applied to the gate line GL. The capacitor Cst may charge a voltage to correspond to the data signal received from the first transistor T1. The second transistor T2 may be connected to the organic electroluminescence device OEL. The second transistor T2 may control driving current flowing through the organic electroluminescence device OEL to correspond to an amount of charge stored in the capacitor Cst.

In some implementations, the pixel PX may further include a plurality of transistors and a greater number of capacitors. The organic electroluminescence device OEL may be connected between the power line PL and the second transistor T2.

FIG. 5 illustrates a partial cross-sectional view of the display panel DP corresponding to the equivalent circuit of FIG. 4. The display panel DP according to an embodiment may include the substrate SUB including the circuit layer DP-CL, an insulation layer IL disposed on the substrate SUB, a first electrode EL1 and a pixel defining layer PDL, which are disposed on the insulation layer IL, at least one organic layer HTR, EML, and ETR disposed on the first electrode EL1, and a second electrode EL2 disposed on the at least one organic layer HTR, EML, and ETR.

In the display panel DP according to an embodiment, the substrate SUB may include the base layer BL and the circuit layer DP-CL disposed on the base layer BL.

The base layer BL may be a member that provides a base surface on which the organic electroluminescence device OEL is disposed. The base layer BL may include a glass substrate, a metal substrate, a plastic substrate, or the like. In some implementations, the base layer BL may be an inorganic layer, an organic layer, or a composite layer.

In an embodiment, the circuit layer DP-CL may be disposed on the base layer BL and may include a buffer layer BFL that is an inorganic layer. The buffer layer BFL may help to prevent impurities from diffusing into the first and second transistors T1 and T2. The buffer layer BFL may be made of silicon nitride (SiNx), silicon oxide (SiOx), silicon oxynitride (SiOxNy), or the like. The buffer layer BFL may be omitted according to materials and a process conditions of the base layer BL.

A semiconductor pattern SP1 (hereinafter, referred to as a first semiconductor pattern) of the first transistor T1 and a semiconductor pattern SP2 (hereinafter, referred to as a second semiconductor pattern) of the second transistor T2 may be disposed on the buffer layer BFL. Each of the first and second semiconductor patterns SP1 and SP2 may be selected from amorphous silicon, polysilicon, and a metal oxide semiconductor.

A first intermediate inorganic layer 10 may be disposed on the first semiconductor pattern SP1 and the second semiconductor pattern SP2. A control electrode GE1 (hereinafter, referred to as a first control electrode) of the first transistor T1 and a control electrode GE2 (hereinafter, referred to as a second control electrode) of the second transistor T2 may be disposed on the first intermediate inorganic layer 10. The first and second control electrodes GE1 and GE2 may be manufactured by the same photolithography process as the scan lines GL (see FIG. 4).

A second intermediate inorganic layer 20 covering the first and second control electrodes GE1 and GE2 may be disposed on the first intermediate inorganic layer 10. An input electrode DE1 (hereinafter, referred to as a first input electrode) and an output electrode SE1 (hereinafter, referred to as a first output electrode) of the first transistor TFR1 may be disposed on the second intermediate inorganic layer 20.

The first input electrode DE1 and the first output electrode SE1 may be connected to the first semiconductor pattern SP1 through first and second contact holes CH1 and CH2, which pass through the first and second intermediate inorganic layers 10 and 20, respectively. The second input electrode EE2 and the second output electrode SE2 may be connected to the second semiconductor pattern SP2 through third and fourth contact holes CH3 and CH4, which pass through the first and second intermediate inorganic layers 10 and 20, respectively. According to an embodiment the first and second transistors T1 and T2 may have a bottom gate structure.

The insulation layer IL may be disposed on the substrate SUB including the circuit layer DP-CL. Referring to FIG. 5, the insulation layer IL covering the first input electrode DE1, the second input electrode DE2, the first output electrode SE1, and the second output electrode SE2 may be disposed on the second intermediate inorganic layer 20. A hole HL may be defined in the insulation layer IL. The insulation layer IL may provide a flat surface on the circuit layer DP-CL except for a portion including the hole HL. The insulation layer IL may be an organic layer. For example, the insulation layer IL may include polyimide. The hole HL defined in the insulation layer IL may be a via hole passing through the insulation layer IL. A height difference between the hole HL and the flat surface of the insulation layer IL may provide a stepped area.

The display device layer DP-OEL may be disposed on the circuit layer DP-CL. The display device layer DP-OEL may be disposed on the insulation layer IL. The display device layer DP-OEL may include the pixel defining layer PDL and the organic electroluminescence device OEL.

The organic electroluminescence device OEL may include the first electrode EL1, the second electrode EL2, and the at least one organic layer HTR, EML, and ETR disposed between the first electrode EL1 and the second electrode LE2. The at least one organic layer HTR, EML, and ETR may include a light emitting layer EML, a hole transfer region HTR, and an electron transfer region ETR. The configuration of the organic electroluminescence device OEL will be described below in more detail.

The first electrode EL1 of the organic electroluminescence device OEL may be disposed on the insulation layer IL. The first electrode EL1 may be electrically connected to the circuit layer DP-CL in the hole HL defined in the insulation layer IL.

The first electrode EL1 may be disposed along the stepped shape of the hole HL defined in the insulation layer IL. The first electrode EL1 may be disposed along the stepped shape of the hole HL to extend to a top surface of the insulation layer IL that comes into contact with the second output electrode SE2 and provides the flat surface. For example, the first electrode EL1 may include at least one stepped part disposed along the stepped shape of the hole HL.

Referring to FIGS. 5 and 6, the first electrode EL1 may include a bottom electrode part EL1-B coming into contact with the circuit layer DP-CL exposed by the hole HL, a side electrode part EL1-S disposed on a side surface of the hole HL, and cover electrode parts EL1-T1 and EL1-T2 extending from the side electrode part EL1-S and disposed on the insulation layer IL. The bottom electrode part EL1-B, the side electrode part EL1-S, and the cover electrode parts EL1-T1 and EL1-T2 may be integrated with each other. The bottom electrode part EL1-B, the side electrode part EL1-S, and the cover electrode parts EL1-T1 and EL1-T2 may be disposed along and conform to the shape of the hole HL, i.e., the stepped part of the first electrode EL1. For example, the first electrode EL1 may include at least one stepped part. The stepped part of the first electrode EL1 may be referred to as the stepped electrode part EL1-H. The first electrode EL1 may include the stepped electrode part EL1-H disposed to correspond to the hole HL and a flat electrode part EL1-E extending from one end of the stepped electrode part EL1-H.

The flat electrode part EL1-E of the first electrode EL1 may extend onto the insulation layer IL to overlap the light emitting layer EML in the third direction DR3. The flat electrode part EL1-E may extend from the stepped electrode part EL1-H and may be disposed on the insulation layer IL. A top surface of the flat electrode part EL1-E may be exposed through an opening OH defined in the pixel defining layer PDL.

As illustrated in FIGS. 5 and 6, the first electrode EL1 may include the stepped electrode part EL1-H or the stepped part to correspond to the hole HL defined in the insulation layer IL. In the display panel DP according to some implementations, the first electrode EL1 may include a plurality of stepped parts or stepped electrode parts according to the shape of the circuit layer DP-CL disposed below the insulation layer IL.

The top surface of the electrode EL1 may be exposed through the opening OH defined in the pixel defining layer PDL. For example, the top surface of the flat electrode part EL1-E of the first electrode EL1 may be exposed through the opening OH defined in the pixel defining layer PDL, and the at least one organic layer HTR, EML, and ETR may be disposed on the exposed top surface of the flat electrode part EL1-E.

The pixel defining layer PDL may be made of a polymer resin. For example, the pixel defining layer PDL may include a polyacrylate-based resin or a polyimide-based resin. The pixel defining layer PDL may further include an inorganic material in addition to the polymer resin. The pixel defining layer PDL may include a light absorbing material or may include a black pigment or a black dye. The pixel defining layer PDL including the black pigment or the black dye may provide a black pixel defining layer. When the pixel defining layer PDL is formed, carbon black may be used as the black pigment or the black dye.

The pixel defining layer PDL may be made of an inorganic material. For example, the pixel defining layer PDL may include silicon nitride (SiNx), silicon oxide (SiOx), silicon oxynitride (SiOxNy), or the like. The pixel defining layer PDL may define the emission area PXA. The emission area PXA and the non-emission area NPXA may be divided by the pixel defining layer PDL.

The first electrode EL1 constituting the organic electroluminescence device OEL may have conductivity. The first electrode EL1 may be made of a metal alloy or a conductive compound. The first electrode EL1 may be an anode. The first electrode EL1 may be the pixel electrode. As described above, the first electrode EL1 may be electrically connected to the circuit layer DP-CL through the hole HL defined in the insulation layer IL.

In the display panel DP according to an embodiment, the first electrode EL1 may be a reflective electrode. In some implementations, the first electrode EL1 may be a transmissive electrode or a transflective electrode. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. In some implementations, the first electrode EL1 may have a structure of a plurality of layers including a reflective layer or transflective layer and a transparent conductive layer made of indium tin oxide (ITO), indium zinc oxide (IZO), zinc oxide (ZnO), or indium tin zinc oxide (ITZO).

For example, the first electrode EL1 may have a structure in which three conductive layers EL-a, EL-b, and EL-c are laminated. The first electrode EL1 may be a multi-layered metal layer in which ITO/Ag/ITO are laminated. For example, the first electrode EL1 may have a lamination structure in which each of the first conductive layer EL-a and third conductive layer is an ITO layer, and the second conductive layer EL-b is an Ag layer.

The display panel DP according to an embodiment may include a light absorbing layer OBL. The light absorbing layer OBL may overlap the hole HL of the insulation layer IL in the third direction DR3 and be disposed on the first electrode EL1. The light absorbing layer OBL may be disposed along the stepped shape of the hole HL. The light absorbing layer OBL may be disposed along the stepped shape of the first electrode EL1 on the first electrode EL1 disposed along the stepped shape of the hole HL. The light absorbing layer OBL may include a bottom part OBL-B, a side part OBL-S, and cover parts OBL-T1 and OBL-T2. The bottom part OBL-B of the light absorbing layer OBL, and the side part OBL-S extending from the bottom part OBL-B, and the cover part OBL-T1 and OBL-T2 may have a stepped shape corresponding to the first electrode EL1 on the whole. For example, the light absorbing layer OBL may cover the stepped part of the first electrode EL1. The light absorbing layer OBL may be disposed on the stepped electrode part EL1-H of the first electrode EL1.

The bottom part OBL-B, the side part OBL-S, and the cover parts OBL-T1 and OBL-T2 of the light absorbing layer OBL may be disposed on a bottom electrode part EL1-B, a side electrode part EL1-S, and cover electrode parts EL1-T1 and EL1-T2, respectively. The cover part OBL-T2 of the light absorbing layer OBL may cover the cover electrode part EL1-T2 of the first electrode EL1 exposed on the insulation layer IL.

The light absorbing layer OBL may be a layer that absorbs light provided from the outside of the display panel DP. The light absorbing layer OBL may be a metal oxide layer. The light absorbing layer OBL may be a black layer including metal oxide. The light absorbing layer OBL may be a light blocking layer that blocks external light incident on the first electrode EL1. In the display panel DP according to an embodiment, the light absorbing layer OBL may include the metal oxide to reduce a reflectance. as compared with a case in which the metal layer is used as a light blocking layer. In addition, when compared with a case in which an organic layer is used as a light blocking layer, out-gassing may be reduced to improve reliability of the display panel DP.

The light absorbing layer OBL may include molybdenum (Mo) oxide. For example, the light absorbing layer OBL may include $MoO_2$ and $MoO_3$. The $MoO_2$ and the $MoO_3$ in the light absorbing layer OBL may be provided at various ratios. For example, a relatively larger amount of $MoO_2$ than $MoO_3$ may be provided in the light absorbing layer OBL.

The light absorbing layer OBL may further include oxides of Group V metal elements in addition to the molybdenum oxide. For example, the light absorbing layer OBL may further include at least one oxide of vanadium (V), niobium (Nb), tantalum (Ta), titanium (Ti), tungsten (W), germanium (Ge), tin (Sn), selenium (Se), or zirconium, in addition to the molybdenum oxide.

For example, the light absorbing layer OBL may include molybdenum oxide and tantalum oxide. The tantalum oxide provided in the light absorbing layer OBL may be $Ta_2O_5$.

When the light absorbing layer OBL includes molybdenum oxide and tantalum oxide, the content of tantalum in the entire light absorbing layer OBL including molybdenum, tantalum, and oxygen may be about 2 at % to about 7 at %. When the content of tantalum is less than about 2 at %, water solubility may increase to deteriorate the stability of the light absorbing layer OBL, which is a metal oxide layer. When the content of tantalum exceeds about 7 at %, processability of an etching process in a patterning process of the light absorbing layer OBL may be deteriorated.

The light absorbing layer OBL may be directly disposed on the first electrode EL1. In this specification, the "direct disposition" may indicate that another layer is not provided between two members. The light absorbing layer OBL may be directly disposed on the first electrode EL1 to prevent light provided from the outside of the display panel DP from being transmitted to the first electrode EL1 covered by the light absorbing layer OBL. For example, the light absorbing layer OBL may absorb light incident from the outside of the display panel DP to reduce an amount of external light transmitted to the first electrode EL1. For example, the light absorbing layer OBL may prevent the external light from being reflected by the stepped part of the first electrode EL1 disposed along the shape of the hole HL.

The light absorbing layer OBL may be disposed along the stepped shape of the hole HL defined in the insulation layer IL and also may be disposed on the stepped part of the first electrode EL1 and be covered by the pixel defining layer PDL. The light absorbing layer OBL may be covered by the pixel defining layer PDL and disposed to not overlap the light emitting layer EML of the organic electroluminescence device OEL.

The light absorbing layer OBL may overlap the first electrode EL1 and the pixel defining layer PDL in the third direction DR3. The light absorbing layer OBL may be disposed between the first electrode EL1 disposed along the stepped shape of the hole HL defined in the insulation layer IL and the pixel defining layer PDL disposed on the first electrode EL1.

The light absorbing layer OBL may absorb the external light to block the light incident to the first electrode EL1 covered by the light absorbing layer OBL. The light absorbing layer OBL may absorb light having a wavelength of, for example, about 350 nm or more. The light absorbing layer OBL may absorb light having a wavelength of about 350 nm to about 780 nm. A degree of light absorption in the light absorbing layer OBL may vary according to a thickness of the light absorbing layer OBL.

The light absorbing layer OBL may have a thickness t of about 350 Å to about 800 Å. For example, the light absorbing layer OBL may have a thickness t of about 400 Å to about 700 Å. For example, the light absorbing layer OBL may have a thickness t of about 450 Å to about 650 Å. If the light absorbing layer OBL were to have a thickness t of about 350 Å or less or a thickness t of about 800 Å or more, the reflectance could increase at the light absorbing layer OBL to limit the reduction effect in reflectance by the external light.

Figure 8:
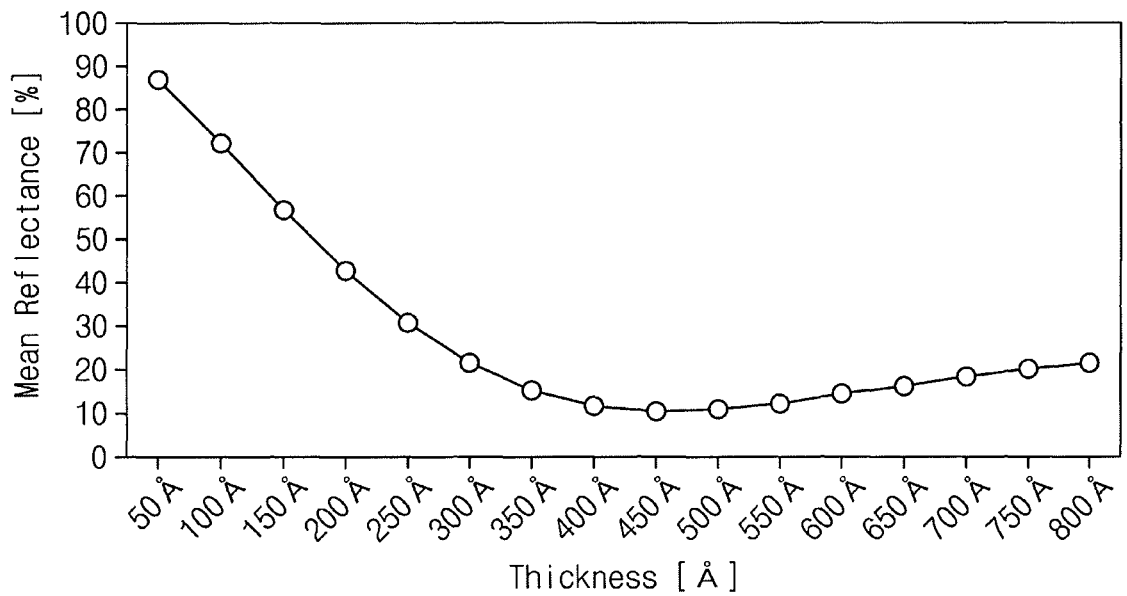
FIGS. 8 and 9 illustrate graphs of a mean reflectance relative to a thickness of a light blocking layer.
Figure 9:
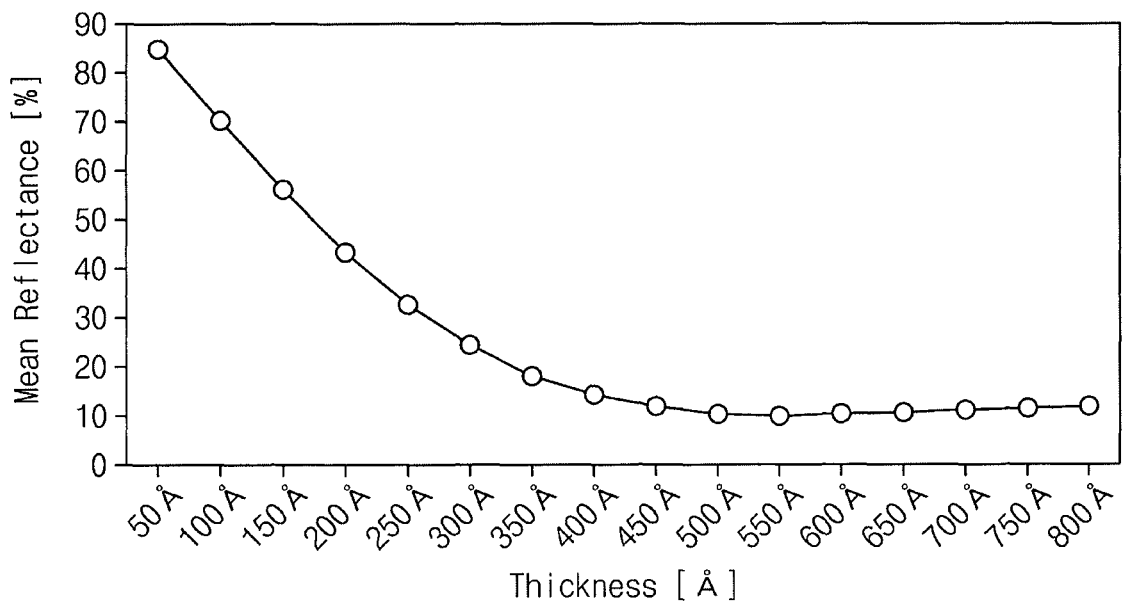

FIGS. 8 and 9 illustrate graphs of mean reflectance (%) according to a thickness of the light absorbing layer OBL. The mean reflectance in the graph illustrated in FIGS. 8 and 9 represents a mean value of reflectances of external light having wavelength regions of about 380 nm to about 730 nm. FIG. 8 illustrates a graph of a mean reflectance with respect to the display panel according to an embodiment, on which the light absorbing layer OBL is disposed on the first electrode EL1 as illustrated in FIGS. 5 to 7. For example, FIG. 8 illustrates a mean reflectance when the first electrode EL1 has a stacked structure of ITO/Ag/ITO, and the light absorbing layer OBL includes the molybdenum oxide and the tantalum oxide. FIG. 9 illustrates a graph of a mean reflectance when the light absorbing layer OBL is disposed on the first electrode EL1, and the organic layer is disposed on the light absorbing layer OBL. In an embodiment, the organic layer may correspond to the pixel defining layer PDL.

Referring to the graphs of FIGS. 8 and 9, when the light absorbing layer OBL has a thickness of about 350 Å or more, it is confirmed that a mean reflectance with respect to the external light is reduced to about 20% or less. Also, referring to FIG. 8, when the light absorbing layer OBL has a thickness of about 800 Å or more, it is confirmed that a mean reflectance with respect to the external light is reduced, but nevertheless may exceed 20%. Thus, when the light absorbing layer OBL has a thickness of about 350 Å to 800 Å, the reflectance in the light absorbing layer OBL may be reduced to improve the display quality of the display panel DP including the light absorbing layer OBL.

In the graph of FIG. 9, which relates to a structure in which the pixel defining layer PLD that is an organic layer is laminated, a tendency similar to that of FIG. 8 is shown. For example, when the pixel defining layer PDL covers the light absorbing layer OBL, the mean reflectance may also be maintained in the case in which the light absorbing layer OBL has a thickness of about 350 Å to 800 Å to effectively block the external light, thereby providing the display panel DP having the improved display quality.

Referring to FIGS. 5 to 7, the light absorbing layer OBL is not disposed on a light emitting path of the organic electroluminescence device OEL. Accordingly, external light incident to the stepped part of the first electrode EL1 may be blocked without affecting light emitting characteristics of the light emitted from the light emitting layer EML. In the display panel DP according to an embodiment, the light absorbing layer OBL does not affect the light emitting characteristics of the organic electroluminescence device OEL. Accordingly, the reflectance of external light may be reduced without deteriorating the display quality.

Referring again FIG. 5, in the display panel DP according to an embodiment, the organic electroluminescence device OEL may include the first electrode EL1, the hole transfer region HTR disposed on the first electrode EL1, the light emitting layer EML disposed on the hole transfer region HTR, the electron transfer region ETR disposed on the light emitting layer EML, and the second electrode EL2 disposed on the electron transfer region ETR.

The hole transport region HTR may be in a form of a single layer made of a single material, a single layer made of materials different from each other, or a multi-layered structure including a plurality of layers made of materials different from each other. For example, the hole transport region HTR may have single layer structures that are respectively formed of a plurality of different materials or a structure of hole injection layer/hole transport layer, hole injection layer/hole transport layer/buffer layer, hole injection layer/buffer layer, hole transport layer/buffer layer, or hole injection layer/hole transport layer/electron stop layer, as examples.

For example, the hole transfer region HTR may include a hole injection layer and a hole transfer layer. A well-known hole injection material and a well-known hole transfer material may be used for the hole injection layer and the hole transfer layer, respectively.

The hole transfer region HTR may be disposed on the first electrode EL1 within the opening OH defined in the pixel defining layer PDL and may also be disposed to extend to an upper portion of the pixel defining layer PDL. In some implementations, the hole transfer region HTR may be patterned to be disposed only in the opening OH.

The light emitting layer EML may be disposed on the hole transport region HTR. The light emitting layer EML may have a single layer structure formed of a single material, a single layer structure formed of materials different from each other, or a multi-layered structure including a plurality of layers formed of materials different from each other.

Suitable materials may be used in the light emitting layer EML. For example, the light emitting layer EML may be formed of materials that emit red, green, and blue colors. In some implementations, the light emitting layer EML may include a phosphor material and a fluorescent material. The light emitting layer EML may include a host or dopant. The light emitting layer EML may be disposed in the opening OH defined in the pixel defining layer PDL.

The electron transport region ETR may be disposed on the light emitting layer EML. The electron transport region ETR may include at least one of a hole stop layer, an electron transport layer, and an electron injection layer, as examples.

When the electron transfer region ETR includes the electron injection layer and the electron transfer layer, an electron injection material and an electron transfer material may be used for the electron injection layer and the electron transfer layer, respectively.

The second electrode EL2 may be disposed on the electron transport region HTR. The second electrode EL2 may be a common electrode. The second electrode IL2 may be a cathode. The second electrode EL2 may be made of a metal alloy or a conductive compound. The second electrode EL2 may be a transmissive electrode, a transflective electrode, or a reflective electrode. When the second electrode EL2 is a transmissive electrode, the second electrode EL2 may be made of a metal oxide, for example, indium tin oxide (ITO), indium zinc oxide (IZO), zinc oxide (ZnO), or indium tin zinc oxide (ITZO).

When the second electrode EL2 is a transflective electrode or reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or mixture (e.g., a mixture of Ag and Mg) thereof. In some implementations, the second electrode EL2 may have a multi-layered structure including a reflective layer or transflective layer and a transparent conductive layer made of indium tin oxide (ITO), indium zinc oxide (IZO), zinc oxide (ZnO), or indium tin zinc oxide (ITZO).

Referring to FIG. 5, the electron transfer region ETR and the second electrode EL2 may be disposed to further extend to an area overlapping the first electrode EL1 and the top surface of the pixel defining layer PDL in the third direction DR3. The second electrode EL2 may be connected to an auxiliary electrode. When the second electrode EL2 is connected to the auxiliary electrode, the second electrode EL2 may have reduced resistance.

In the display panel DP according to an embodiment, the first electrode EL1 of the first electrode EL1 and the second electrode EL2, which face each other, may be a reflective electrode, and the second electrode EL2 may be a transmissive electrode, as an example.

The encapsulation layer TFE may be disposed on the second electrode EL2. The encapsulation layer TFE may be disposed to cover the second electrode EL2. The encapsulation layer TFE may be provided as a single layer or as a laminate in which a plurality of layers are laminated. The encapsulation layer TFE may include at least one layer of an organic layer or an inorganic layer. In some implementations, the encapsulation layer TFE may include at least one organic layer and at least one inorganic layer.

The encapsulation layer TFE may be, for example, a thin film encapsulation layer. The encapsulation layer TFE may help to protect the organic electroluminescent device OEL. The encapsulation layer TFE may cover the top surface EL2 disposed in the opening OH and may fill the opening OH. In some implementations, the encapsulation layer TFE may be omitted. In some implementations, a separator encapsulation member may be added to a top surface of the organic electroluminescent device OEL.

Figure 10:
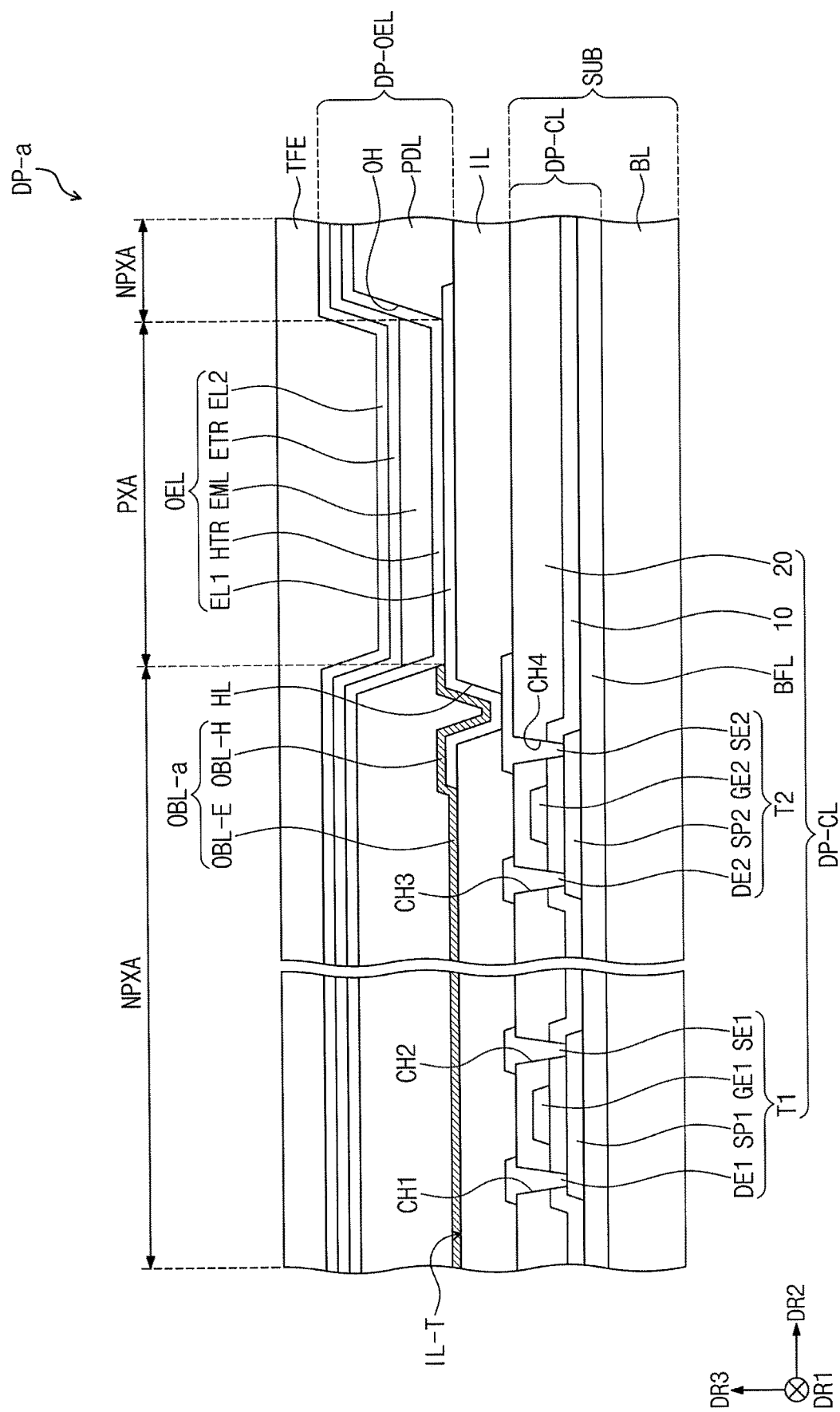
FIG. 10 illustrates a cross-sectional view of the display panel according to an embodiment.

FIG. 10 illustrates a cross-sectional view of the display panel according to an embodiment. In the descriptions of the display panel with reference to FIG. 10, content that is duplicative of that described with reference to FIGS. 1 to 7 will not be repeated. Thus, their differences will be mainly described.

A display panel DP-a of FIG. 10 according to an embodiment may be different in shape of a light absorbing layer OBL-a when compared with the display panel DP of FIGS. 5 to 7. In the display panel DP-a of FIG. 10 according to an embodiment, the light absorbing layer OBL-a may include a stepped absorbing part OBL-H overlapping the hole HL defined in the insulation layer IL in the third direction DR3 and an extension absorbing part OBL-E extending from the stepped absorbing part OBL-H and disposed on a top surface IL-T of the insulation layer IL.

The extension absorbing part OBL-E of the light absorbing layer OBL-a may extend from the stepped absorbing part OBL-H and may be disposed on the first and second transistors T1 and T2. The extension absorbing part OBL-E of the light absorbing layer OBL-a may be disposed between the insulation layer IL and the pixel defining layer PDL. The extension absorbing part OBL-E may not overlap the light emitting layer EML.

In the display panel according to an embodiment, the light absorbing layer may be disposed on the stepped part of the electrode, which has a high reflectance, to reduce the reflection of external light incident on the stepped part of the electrode, thereby improving the display quality. Also, the display panel according to an embodiment may include a metal oxide in the light absorbing layer to prevent undesirable actions such as the out-gassing from occurring, thereby providing high reliability when compared with the case in which the light blocking layer is made of the organic material.

Figure 11:
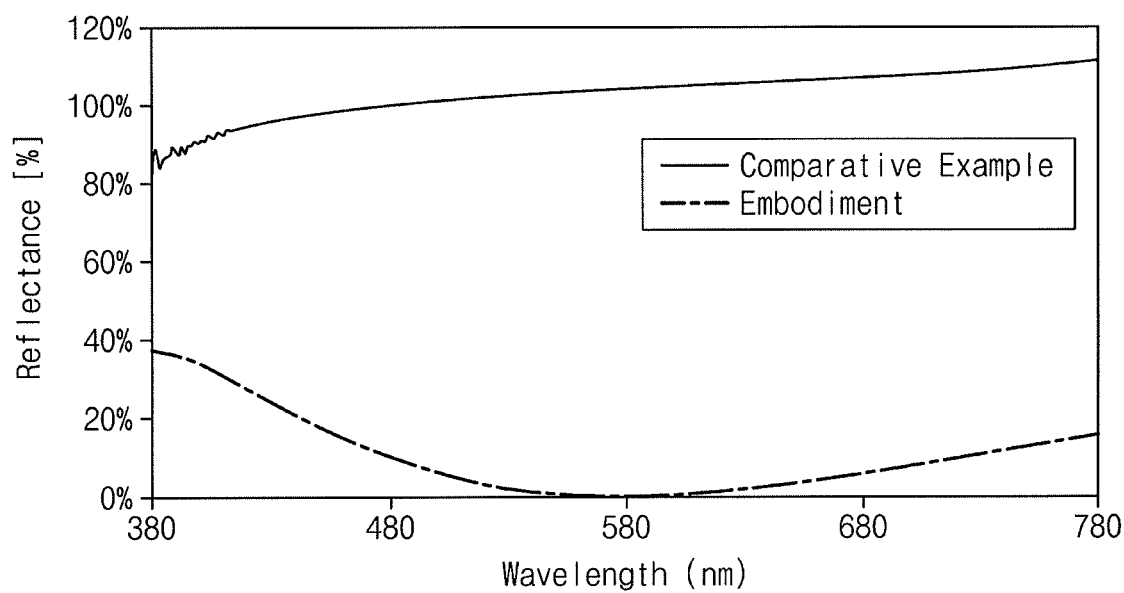
FIG. 11 illustrates a graph of a reflectance relative to a wavelength region.

FIG. 11 illustrates a graph showing a reflectance percentage in relation to a wavelength. The reflectance values in FIG. 1 represent a relative reflectance based on the reflectance of aluminum (Al) being 100%. In FIG. 11, the Comparative Example shows a reflectance according to a wavelength in the display panel when the light absorbing layer is not provided, and the Embodiment shows a reflectance according to a wavelength in the display panel when the light absorbing layer is disposed on the stepped part of the first electrode, as in the display panel according to an embodiment.

Referring to the results of FIG. 11, in the case of the Embodiment in which the light absorbing layer is provided, it may be confirmed that reflectance is reduced in an entire wavelength region when compared with the Comparative Example. In the case of the Comparative Example, the mean reflectance was about 103.1% in the entire wavelength region. The reflectance was about 103.4% at a wavelength of about 550 nm. In the case of the Example, a mean reflectance was about 10.3% in the entire wavelength region, and a reflectance was about 0.6% at the wavelength of about 550 nm. In comparison with the Comparative Example, according to an embodiment, it may be confirmed that the reflectance was less than about 1/10 of that of the Comparative Example.

In the display panel according to an embodiment, the light absorbing layer including the metal oxide may be disposed on the electrode to absorb the external light provided to the electrode, thereby reducing the reflectance in the display panel by the external light.

Figure 12:
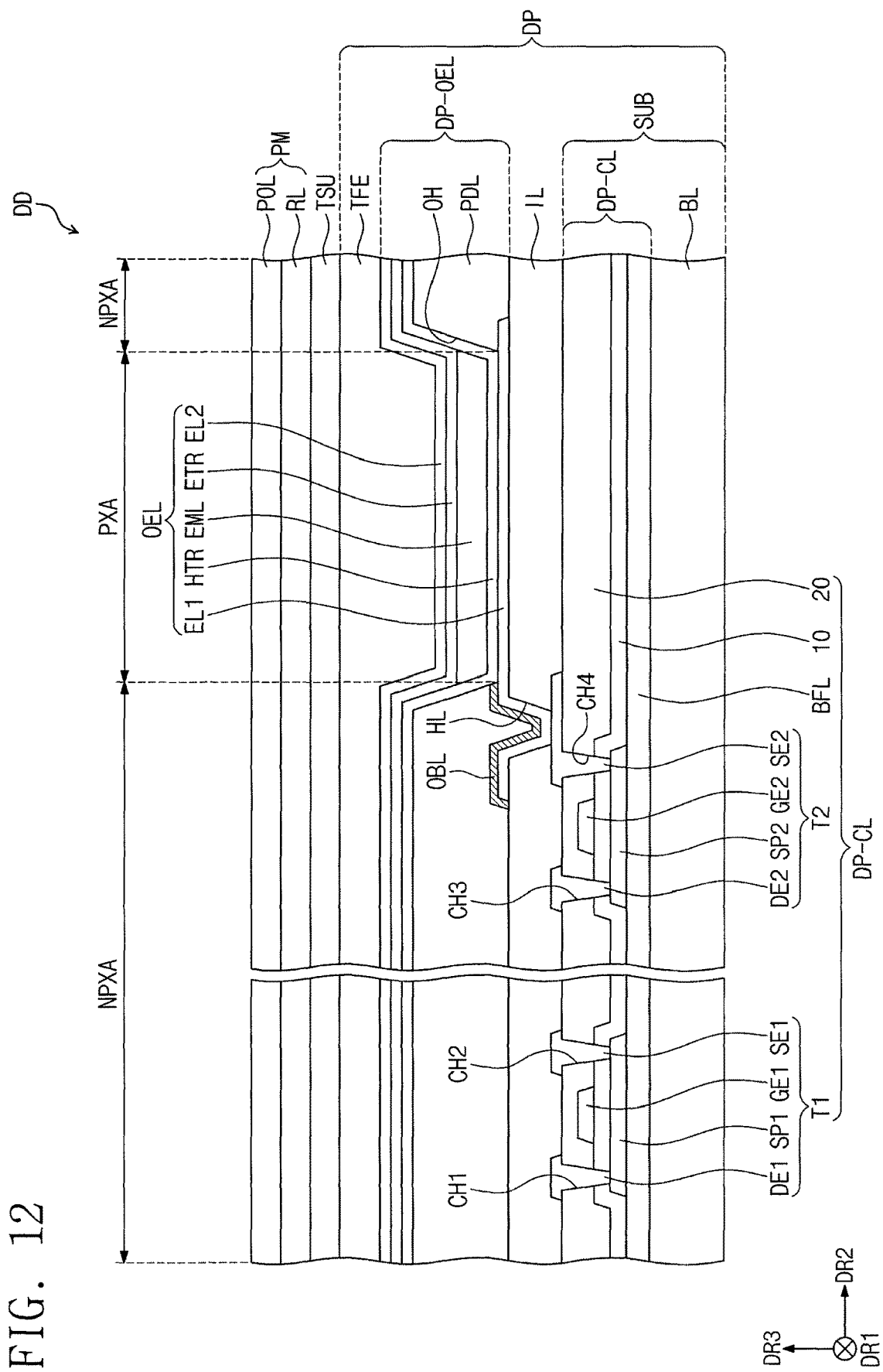
FIG. 12 illustrates a cross-sectional view of the display device according to an embodiment.

FIG. 12 illustrates a cross-sectional view of the display device according to an embodiment. The display device DD according to an embodiment may include the display panel DP including the light absorbing layer OBL according to an embodiment and a polarizing member PM disposed on the display panel DP.

The display panel as described above may be applied to the display panel DP provided in the display device DD according to the embodiment illustrated in FIG. 12. The same content as that of the above-described display panel DP according to an embodiment may be applied to the display panel DP provided in the display device DD according to an embodiment.

In the display device DD according to an embodiment, the display panel DP may include a substrate SUB including a circuit layer DP-CL, an insulation layer IL disposed on the substrate SUB and having a hole HL, and a display device layer DP-OEL disposed on the insulation layer IL. The display device layer DP-OEL may include a pixel defining layer PDL defining an emission area PXA and an organic electroluminescence device OEL. An encapsulation layer TFE may be disposed on the display device layer DP-OEL.

The display panel DP according to an embodiment may include a first electrode EL1 electrically connected to a circuit layer DP-CL in the hole HL of the insulation layer IL and a light absorbing layer OBL overlapping the hole HL in the third direction DR3 and disposed on the first electrode EL1. The light absorbing layer OBL may be a metal oxide layer. The light emitting layer OBL may cover a stepped part of the first electrode EL1 to perform a light blocking function for preventing external light from being transmitted to the first electrode EL1.

The light absorbing layer OBL may include molybdenum oxide. For example, the light absorbing layer OBL may include molybdenum oxide and tantalum oxide.

A polarizing member PM may be disposed on the display panel DP. The polarizing member PM may perform a function of blocking reflected light when light from the outside of the display device DD is incident onto the display panel DP and then emitted again.

The polarizing member PM may be a circular polarizer having an antireflection function. In some implementations, the polarizing member PM may include a linear polarizer POL and a λ/4 phase retarder RL. The linear polarizer POL may be disposed on the λ/4 phase retarder RL. In the polarizing member PM, a λ/2 phase retarder may be further disposed between the linear polarizer POL and the λ/4 phase retarder RL. The polarizing member PM including the linear polarizer POL and the λ/4 phase retarder RL may perform the antireflection function.

In the display device DD according to an embodiment, the polarizing member PM may be disposed on the display panel DP to reduce reflectivity by external light. The light absorbing layer OBL may be provided on the stepped part of the first electrode EL1 of the display panel DP to effectively block external light at a portion of the electrode on which the stepped part is provided, thereby minimizing the deterioration of the display quality by the reflection of the external light.

For example, the polarized state of the light polarized by the polarizing member PM may be altered. In this case, an effect of reducing the reflectivity of the external light by the polarizing member PM may be reduced. However, the display device DD according to an embodiment may include the light absorbing layer OBL covering the stepped portion of the first electrode EL1 of the display panel DP. Thus, even though the polarized state is altered at the stepped portion, the light absorbing layer OBL may absorb the external light to block the external light provided to the stepped portion of the first electrode EL1 disposed below the light absorbing layer OBL, thereby reducing the reflectance in the display panel DP of the external light.

The display device DD according to an embodiment may include an input sensor TSU disposed between the display panel DP and the polarizing member PM. The input sensor TSU may be directly disposed on an encapsulation layer TFE of the display panel DP. For example, the input sensor TSU may be directly disposed on the display panel DP without using a separate adhesive member. In an embodiment, the input sensor TSU may be omitted.

By way of summation and review, when external light is incident onto a display device that is being used, the external light may be reflected by an electrode or the like within a display panel to cause deterioration in display quality of the display device. Accordingly, it is desirable to improve the display quality of a display device by reducing the reflectivity of light provided from the outside.

According to embodiments, a light absorbing layer including a metal oxide may be disposed on the electrode having high reflectivity to reduce the reflectance of the external light, thereby improving the display quality. In the display device according to an embodiment, the light absorbing layer including the metal oxide may be disposed on the electrode. A polarizing member may be disposed on the display panel to reduce the reflection by the external light, thereby improving the display quality.

Embodiments provide a display panel that reduces a reflectance of external light on a stepped part of an electrode having high reflectivity.

Embodiments provide a display device that is improved in display quality by reducing a reflectance of external light on a stepped part of an electrode.

Embodiments provide a display panel in which a light absorbing layer is disposed on a stepped part of the electrode to reduce the reflectivity by the external light.

Embodiments provide a display panel including a light absorbing layer on a stepped part of the electrode and the display device including the polarizing member on the display panel to reduce the reflectivity by the external light and thereby improve the display quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof the present invention as set forth in the following claims.

What is claimed is:

1. A display panel, comprising:
 a substrate including a circuit layer;
 an insulation layer on the substrate, the insulation layer defining a hole;
 a first electrode on the insulation layer, the first electrode being electrically connected to the circuit layer in the hole;
 a light absorbing layer on the first electrode and overlapping the hole;
 a pixel defining layer on the insulation layer and defining an opening through which a top surface of the first electrode is exposed;
 at least one organic layer including a light emitting layer in the opening; and
 a second electrode on the at least one organic layer.

2. The display panel as claimed in claim 1, wherein the light absorbing layer includes molybdenum (Mo) oxide.

3. The display panel as claimed in claim 2, wherein the light absorbing layer further includes at least one oxide of vanadium (V), niobium (Nb), tantalum (Ta), titanium (Ti), tungsten (W), germanium (Ge), tin (Sn), selenium (Se), or zirconium.

4. The display panel as claimed in claim 1, wherein the light absorbing layer includes molybdenum (Mo) oxide and tantalum (Ta) oxide.

5. The display panel as claimed in claim 1, wherein the light absorbing layer is directly on the first electrode.

6. The display panel as claimed in claim 1, wherein the light absorbing layer is covered by the pixel defining layer and does not overlap the light emitting layer.

7. The display panel as claimed in claim 1, wherein the light absorbing layer overlaps the first electrode and the pixel defining layer.

8. The display panel as claimed in claim 1, wherein the light absorbing layer has a thickness of 350 Å to 800 Å.

9. The display panel as claimed in claim 1, wherein the light absorbing layer further includes an extension absorbing part extending to a top surface of the insulation layer and non-overlapping the light emitting layer.

10. The display panel as claimed in claim 1, wherein the first electrode includes a reflective electrode, and the second electrode includes a transmissive electrode.

11. The display panel as claimed in claim 1, wherein the first electrode includes a multilayered metal layer of ITO/Ag/ITO.

12. The display panel as claimed in claim 1, wherein the first electrode includes:
a stepped electrode part along a stepped portion of the hole; and
a flat electrode part extending from the stepped electrode part, the flat electrode part being on the insulation layer.

13. The display panel as claimed in claim 1, wherein the at least one organic layer includes:
a hole transfer region between the first electrode and the light emitting layer; and
an electron transfer region between the light emitting layer and the second electrode.

14. The display panel as claimed in claim 1, further comprising an encapsulation layer on the second electrode.

15. A display panel, comprising:
a substrate including a circuit layer;
an insulation layer on the substrate;
a first electrode on the insulation layer, the first electrode including at least one stepped part;
a light absorbing layer on the at least one stepped part;
a pixel defining layer on the insulation layer and defining an opening through which a top surface of the first electrode is exposed;
at least one organic layer in the opening, the at least one organic layer including a light emitting layer on the first electrode exposed through the opening; and
a second electrode on the at least one organic layer.

16. The display panel as claimed in claim 15, wherein:
a hole is defined in the insulation layer, and
the at least one stepped part overlaps the hole.

17. The display panel as claimed in claim 15, wherein the light absorbing layer includes molybdenum (Mo) oxide and tantalum (Ta) oxide.

18. A display device comprising:
a display panel; and
a polarizing member on the display panel,
wherein the display panel includes:
a substrate including a circuit layer;
an insulation layer on the substrate and defining a hole;
a first electrode on the insulation layer and electrically connected to the circuit layer in the hole;
a light absorbing layer overlapping the hole, the light absorbing layer being on the first electrode;
a pixel defining layer on the insulation layer and defining an opening through which a top surface of the first electrode is exposed;
at least one organic layer including a light emitting layer in the opening; and
a second electrode on the at least one organic layer.

19. The display device as claimed in claim 18, wherein the polarizing member includes a linear polarizer and a $\lambda/4$ phase retarder between the linear polarizer and the display panel.

20. The display device as claimed in claim 18, wherein the light absorbing layer includes molybdenum (Mo) oxide and tantalum (Ta) oxide.

* * * * *